(12) United States Patent
Wang et al.

(10) Patent No.: US 11,005,442 B2
(45) Date of Patent: May 11, 2021

(54) ARTIFICIAL TRANSMISSION LINE USING T-COIL SECTIONS

(71) Applicant: Analog Devices International Unlimited Company, Limerick (IE)

(72) Inventors: Xudong Wang, Colorado Springs, CO (US); Michael W. Bagwell, Colorado Springs, CO (US); William B. Beckwith, Larkspur, CO (US); Thomas E. Schiltz, Colorado Springs, CO (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/421,226

(22) Filed: May 23, 2019

(65) Prior Publication Data

US 2020/0373897 A1 Nov. 26, 2020

(51) Int. Cl.
*H03H 7/09* (2006.01)
*H03H 7/18* (2006.01)

(52) U.S. Cl.
CPC .................................. *H03H 7/18* (2013.01)

(58) Field of Classification Search
CPC ... H03H 7/07; H03H 7/18; H03H 7/09; H04B 3/40
USPC .................................................. 333/138, 140
See application file for complete search history.

(56) References Cited

U.S. PATENT DOCUMENTS

| 519,346 A | 5/1894 | Pupin |
| 2,085,952 A * | 7/1937 | Cauer ...................... H04B 3/40 333/132 |
| 2,659,052 A * | 11/1953 | Bess ........................ H03H 7/34 333/138 |

(Continued)

FOREIGN PATENT DOCUMENTS

| JP | S5228839 B1 | 7/1977 |
| JP | 08288711 A | 11/1996 |

(Continued)

OTHER PUBLICATIONS

"U.S. Appl. No. 15/865,178, Non Final Office Action dated May 13, 2019", 7 pgs.

(Continued)

*Primary Examiner* — Dean O Takaoka
(74) *Attorney, Agent, or Firm* — Schwegman Lundberg & Woessner, P.A.

(57) ABSTRACT

An electrical circuit can be formed at least in part using lumped or discrete circuit elements to provide an artificial transmission line structure that can mimic the electrical properties of a corresponding actual transmission line structure. Such an artificial transmission line structure can generally consume less area than an actual transmission line structure lacking such lumped or discrete elements. Such an artificial transmission line structure can be formed using two or more "unit cells" such as by cascading such cells as shown and described herein. The present inventors have recognized, among other things, that a unit cell of an artificial transmission line structure can include a t-coil (Continued)

section comprising magnetically-coupled inductors. Such an artificial transmission line structure can be used for applications such as phase shifting or to provide a delay line having a substantially constant group delay, among other applications.

20 Claims, 6 Drawing Sheets

(56) References Cited

U.S. PATENT DOCUMENTS

| | | | |
|---|---|---|---|
| 2,783,438 | A | 2/1957 | Perkins |
| 3,436,687 | A | 4/1969 | Andrews et al. |
| 3,718,873 | A | 2/1973 | Garver |
| 4,063,201 | A | 12/1977 | Komatsubara et al. |
| 4,837,532 | A | 6/1989 | Lang |
| 4,885,562 | A | 12/1989 | Ouvrard et al. |
| 4,994,773 | A | 2/1991 | Chen et al. |
| 5,148,130 | A | 9/1992 | Dietrich |
| 5,339,462 | A | 8/1994 | Staudinger et al. |
| 5,430,418 | A | 7/1995 | Blodgett |
| 5,777,532 | A | 7/1998 | Lakin |
| 5,973,567 | A | 10/1999 | Heal et al. |
| 6,052,039 | A | 4/2000 | Chiou et al. |
| 6,476,685 | B1 * | 11/2002 | Cheung ............ H03H 7/0115 333/140 |
| 6,556,096 | B1 * | 4/2003 | Ouacha ............ H03H 11/265 333/138 |
| 6,900,695 | B2 | 5/2005 | Ouacha |
| 6,950,590 | B2 | 9/2005 | Cheung et al. |
| 7,170,353 | B2 | 1/2007 | Amano |
| 7,239,218 | B2 | 7/2007 | Nakamura |
| 7,446,712 | B2 | 11/2008 | Itoh et al. |
| 7,459,995 | B2 | 12/2008 | Suzuki |
| 7,602,240 | B2 | 10/2009 | Gao et al. |
| 7,719,386 | B2 | 5/2010 | Atsumo et al. |
| 7,839,236 | B2 * | 11/2010 | Dupuy ............ H01P 1/20363 333/136 |
| 7,928,817 | B2 | 4/2011 | Atsumo |
| 8,264,300 | B2 | 9/2012 | Cisco |
| 8,294,538 | B2 * | 10/2012 | Ueda ............ H01P 1/207 333/236 |
| 8,339,212 | B2 * | 12/2012 | Wu ............ H01P 1/203 333/12 |
| 8,350,642 | B2 | 1/2013 | Jensen |
| 8,410,863 | B2 | 4/2013 | Satou et al. |
| 9,059,679 | B2 | 6/2015 | Edelstein et al. |
| 9,853,340 | B2 | 12/2017 | Leipold et al. |
| 9,853,623 | B2 * | 12/2017 | Larson ............ H03H 7/21 |
| 10,116,281 | B2 | 10/2018 | Lee et al. |
| 10,608,313 | B2 | 3/2020 | Wang et al. |
| 2013/0328642 | A1 * | 12/2013 | Ma ............ H03H 7/0138 333/177 |
| 2015/0048901 | A1 * | 2/2015 | Rogers ............ H03H 3/00 333/175 |
| 2019/0214700 | A1 | 7/2019 | Wang et al. |

FOREIGN PATENT DOCUMENTS

| | | |
|---|---|---|
| JP | 2001016062 A | 1/2001 |
| JP | 2001016063 A | 1/2001 |
| JP | 2009253491 A | 10/2009 |
| JP | 4400557 B2 | 11/2009 |
| KR | 101688899 B1 | 12/2016 |
| WO | WO-2012060775 A1 | 5/2012 |

OTHER PUBLICATIONS

Amin, et al., "High Power Combiner/Divider Design for Dual Band RF Power Amplifiers", Proc. of the Intl. Conference on Electromagnetics in Advanced Applications, (2015), 1036-1039.

Caloz, et al., "A Novel Composite Right-/Left-Handed Coupled-Line Directional Coupler With Arbitrary Coupling Level and Broad Bandwidth", IEEE Transactions on Microwave Theory and Techniques, vol. 52, No. 3, (Mar. 2004), 13 pgs.

Camacho-Penalosa, C., et al., "Derivation and General Properties of Artificial Lossless Balanced Composite Right/Left-Handed Transmission Lines of Arbitrary Order", Progress in Electromagnetics Research B, vol. 13, (2009), 19 pgs.

De Astis, Giuseppe, et al., "A 5-GHz Fully Integrated Full PMOS Low-Phase-Noise LC VCO", IEEE Journal of Solid-State Circuits, vol. 40, No. 10, (Oct. 2005), 6 pgs.

Duran-Sindreu, Miguel, et al., "Composite Right-/Left-Handed Transmission Line Metamaterials", Wiley Encyclopedia of Electrical and Electronics Engineering, (2013), 25 pgs.

Entesari, Kamran, et al., "CMOS Distributed Amplifiers with Extended Flat Bandwidth and Improved Input Matching using Gate Line with Coupled Inductors", IEEE Transactions on Microwave Theory and Techniques, vol. 57, No. 12, (Dec. 2009), 10 pgs.

Kuo, Tsung-Nan, et al., "A Compact LTCC Branch-Line Coupler Using Modified-T Equivalent—Circuit Model for Transmission Line", IEEE Microwave and Wireless Components Letters, vol. 16, No. 2, (Feb. 2006), 3 pgs.

Larocca, Tim, et al., "Millimeter-Wave CMOS Digital Controlled Artificial Dielectric Differential Mode Transmission Lines for Reconfigurable ICs", IEEE MTT-S Intl. Microwave Symposium Digest, Atlanta, GA, USA, (Jun. 2008), 4 pgs.

Lin, Yo-Shen, et al., "Design of an LTCC Tri-Band Transceiver Module for GPRS Mobile Applications", IEEE Transactions on Microwave Theory and Techniques, vol. 52, No. 12, (Dec. 2004), 7 pgs.

Liu, Xuan-Hong, et al., "Super Compact and Ultrabroadband Power Divider Using Silicon-Based Integrated Passive Device Technology", IEEE Transactions on Components, Packaging and Manufacturing Technology, vol. 6, No. 12, (Dec. 2016), 10 pgs.

Lu, et al., "A Miniaturized Wilkinson Power Divider with CMOS Active Inductors", IEEE Microwave and Wireless Components Letters, vol. 15, No. 11, (Nov. 2005), 775-777.

Olvera, Cervantes, et al., "A Wideband Quadrature Power Divider/Combiner and its Application to an Improved Balanced Amplifier", Progress in Electromagnetics Research C, vol. 34, (2013), 29-39.

Osman, et al., "Analysis and Design of UWB Modified Two-Sections Wilkinson Power Splitter", 16th International Conference on Aerospace Sciences and Aviation Technology, Paper: ASAT-16-157-CM, (May 2015), 14 pgs.

Phinney, Joshua W., et al., "Synthesis of Lumped Transmission-Line Analogs", IEEE Transactions of Power Electronics, vol. 22, No. 4, (Jul. 2007), 12 pgs.

Raab, et al., "RF and Mircowave Power Amplifier and Transmitter Technlogies—Part 3", High Frequency Electronics, (Sep. 2003), 34-48.

Ross, Bob, "T-Coils and Bridged-T Networks", European IBIS Summit, Naples, Italy; Teraspeed Consulting Group LLC, (Sep. 2007), 24 pgs.

Sanchez-Martinez, J.J., et al., "Artificial Transmission Line with Left/Right-Handed Behavior Based on Wire Bonded Interdigital Capacitors", Progress in Electrornagnetics Research B, vol. 11, (2009), 20 pgs.

Song, Pingyue, et al., "Wideband mm-Wave Phase Shifters Based on Constant-Impedance Tunable Transmission Lines", IEEE MTT-S Intl, Microwave Symposium (IMS), San Francisco, CA, USA, (May 2016), 4 pgs.

Wang, Youzhen, et al., "Coupling Characteristics between Composite Right-/Left-Handed Transmission Line and Conventional Transmission Line", Intl. Conference on Microwave and Millimeter Wave Technology, Nanjing, China, (Apr. 2008), 4 pgs.

Woods, Wayne H., et al., "CMOS Millimeter Wave Phase Shifter Based on Tunable Transmission Lines", Proc. of the IEEE Custom Integrated Circuits Conference, San Jose, CA, USA, (Sep. 2013), 4 pgs.

"U.S. Appl. No. 15/865,178, Notice of Allowance dated Dec. 9, 2019", 7 pgs.

"U.S. Appl. No. 15/865,178, Response filed Aug. 13, 2019 to Non-Final Office Action dated May 13, 2019", 9 pgs.

(56) References Cited

OTHER PUBLICATIONS

"Chinese Application Serial No. 202020591527.7, Notification to Make Rectification dated Aug. 12, 2020", w/o English Translation, 1 pg.

* cited by examiner

ARTIFICIAL TRANSMISSION LINE USING T-COIL SECTIONS

FIELD OF THE DISCLOSURE

This document pertains generally, but not by way of limitation, to apparatus and techniques that can be used for processing electrical signals in the analog domain, and more particularly, to one or more of filtering or delaying electrical signals using transmission-line-like behavior.

BACKGROUND

A transmission line structure can be defined as an electrical structure where the physical dimensions of the structure are comparable to or greater than a wavelength of a signal being conveyed by the transmission line structure. For example, structures that have physical dimensions (such as length) that are comparable to at least a tenth of a wavelength, at least a quarter of a wavelength, at least a half of a wavelength, or greater in extent, can be referred to as exhibiting transmission line characteristics. In another formulation, a transmission line structure can be considered an electrical structure where the electrical characteristics of the transmission line structure itself substantially affect or dominate the impedance seen by the source driving the transmission line structure, and the impedance driving the load at a distal end of the transmission line structure.

SUMMARY OF THE DISCLOSURE

Transmission line structures have a variety of applications. For example, in microwave and millimeter-wave circuits, transmission line structures can be used in part to implement baluns (e.g., to convert an unbalanced or single-ended signal into a balanced signal), matching circuitry, delay lines, power combiners, or couplers, as illustrative examples. In various applications, an electrical length of a transmission line is a specified fraction of an operating wavelength to enable a circuit incorporating the transmission line to function properly. As mentioned above, an electrical length corresponds generally to the physical dimensions of the transmission line structure, and such an electrical length is impacted by dielectric properties of the medium surrounding the transmission line structure. The present inventors have recognized, among other things, that constraints on a minimum length of transmission line structures may make such structures difficult to implement efficiently (or at all) in radio frequency or microwave monolithic integrated circuits or integrated modules, particularly when an operating frequency is below about ten gigahertz (GHz), for example. Put another way, in the absence of the present subject matter, physical dimensions or circuit area may preclude use of transmission line structures in monolithic circuits when an operating wavelength approaches a substantial fraction of a centimeter or more.

In order to address such challenges, the present inventors have recognized, among other things, that an electrical circuit (such as a "two port" circuit comprising a two-terminal input and a two-terminal output) can be formed at least in part using lumped or discrete circuit elements to provide an artificial transmission line structure that can mimic the electrical properties of a corresponding actual transmission line structure. Such an artificial transmission line structure can generally consume less area than an actual transmission line structure lacking such lumped or discrete elements. In a variation of such a structure, an artificial transmission line structure can also make use of short actual transmission line segments in addition to lumped or discrete elements.

An artificial transmission line structure can be formed using two or more "unit cells" such as by cascading such cells as shown and described herein. The present inventors have recognized, among other things, that a unit cell of an artificial transmission line structure can include a t-coil section comprising magnetically-coupled inductors. A coupling coefficient corresponding to mutual magnetic coupling between the inductors can be established at an intermediate value to help linearize a phase response of the artificial transmission line structure. Such an artificial transmission line structure can be used for applications such as phase shifting or to provide a delay line having a substantially constant group delay (over a specified operating bandwidth), among other applications.

In an example, such as comprising an electronic circuit, an artificial transmission line structure can include at least two unit cells, wherein a respective unit cell amongst the at least two unit cells comprises a first t-coil section defined by a first inductor mutually magnetically coupled and conductively coupled in series with a second inductor, and a first shunt capacitor coupled to a node between the first inductor and the second inductor, and a third inductor conductively coupled with the second inductor. The third inductor can be arranged to suppress or inhibit mutual magnetic coupling with the first inductor and the second inductor. The first, second, and third inductors can be specified to provide a substantially linear phase response in a specified range of frequencies. In an illustrative example, a coupling coefficient corresponding to mutual magnetic coupling between the first inductor and the second inductor is established at an intermediate value between zero and one to provide a substantially linear phase response, such as having an intermediate value between about 0.5 and about 0.7. In an example, a phase shifter circuit can include at least two selectable electrical paths coupling an input port to an output port, where one of the at least two selectable electrical paths comprises the artificial transmission line structure.

In an example, a technique can include using an electronic circuit as described in other examples herein. For example, a technique such as a method can include controlling a delay value for an electrical signal using a phase shifter circuit, the method comprising receiving a control signal and, in response, selectively coupling the electrical signal through one of a first electrical path to provide a first specified phase shift or a second electrical path to provide a second specified phase shift different than the first specified phase shift, where the first electrical path comprises an artificial transmission line structure comprising at least two unit cells, wherein a respective unit cell amongst the at least two unit cells comprises a first t-coil section defined by a first inductor mutually magnetically coupled and conductively coupled in series with a second inductor, and a first shunt capacitor coupled to a node between the first inductor and the second inductor and a third inductor conductively coupled with the second inductor.

Generally, the examples described in this document can be implemented in whole or in part within an integrated circuit package or module, such as monolithically integrated.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Transmission line structures generally have associated electrical characteristics such as a time delay (e.g., group delay), phase shift, characteristic impedance, or other parameters. As mentioned above, an artificial transmission line structure can be formed using lumped or discrete elements to provide electrical behavior similar to an actual transmission line structure. In an actual transmission line structure, electrical characteristics such as capacitance per unit length, inductance per unit length, conductance, and shunt resistance, generally result from distributed electrical characteristics of the conductors and dielectric materials forming the transmission line structure. By contrast, in an artificial transmission line structure, at least some electrical elements are lumped components, such as inductors or capacitors. Various topologies can be used to provide an artificial transmission line. For example, a left-handed artificial transmission line can be established using series-connected capacitors with shunt-connected inductors. Similarly, a right-handed artificial transmission line can be established using series-connected inductors with shunt-connected capacitors. A "composite" right-handed and left-handed structure can be formed using a combination of series-connected inductors and capacitors, and shunt networks comprising parallel-connected inductors and capacitors.

As mentioned briefly above, the present inventors have recognized, among other things, that an artificial transmission line structure can be formed using two or more cascaded unit cells, where the unit cells include respective t-coil sections. An artificial transmission line structure including such unit cells can provide electrical characteristics similar to an actual transmission line structure, including establishing a specified characteristic impedance (defined as a ratio of a voltage amplitude divided by a current amplitude of an electrical signal propagating through the line), group delay, or corresponding phase shift, as illustrative examples.

Figure 1A:
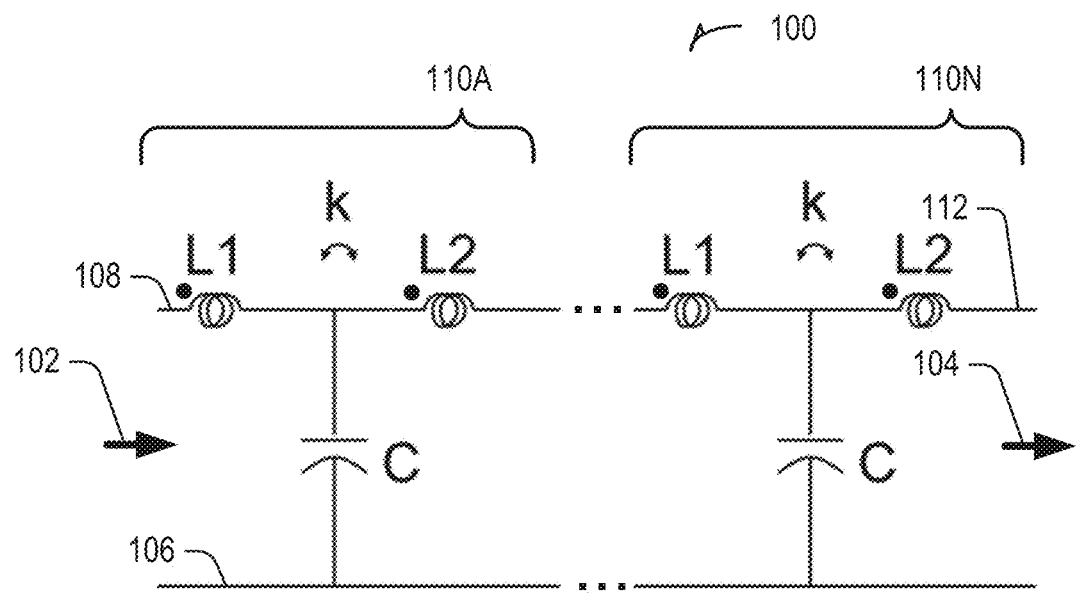
FIG. 1A illustrates generally an example comprising an artificial transmission line that can include two or more unit cells, the unit cells comprising respective t-coil arrangements.

FIG. 1A illustrates generally an example comprising an artificial transmission line 100 that can include two or more unit cells 110A through 110N, the unit cells comprising respective t-coil sections. The t-coils can be defined by a first inductor, L1, and a second inductor L2, coupled in series, along with a shunt capacitor C coupled to a node between the first and second inductors L1 and L2 and a common node 106. The artificial transmission line 100 shown in FIG. 1 can represent a variation on a "right handed" artificial transmission line unit-cell topology. Coupled inductors L1 and L2 can be magnetically linked, and such flux linkage can be represented by a coefficient of mutual magnetic coupling "k," having a value between zero and one. A value of zero indicates no mutual magnetic coupling between the inductors L1 and L2, and a value of one indicates perfect magnetic coupling. A first port 102 (e.g., an input port) can be defined by two terminals comprising a node 108 and the common node 106, and a second port 104 (e.g., an output port) can be defined by a node 112 and the common node 106. The example of FIG. 1A shows an unbalanced configuration but could also be implemented in a balanced configuration with corresponding inductances added along the line denoting the common node 106. Generally, the examples shown in this document are unbalanced configurations but could also be implemented using a balanced configuration. In part, a count of cascaded unit cells (e.g., comprising copies of unit cell 110A) can be used to establish a specified phase shift or time delay (e.g., group delay).

Figure 1B:
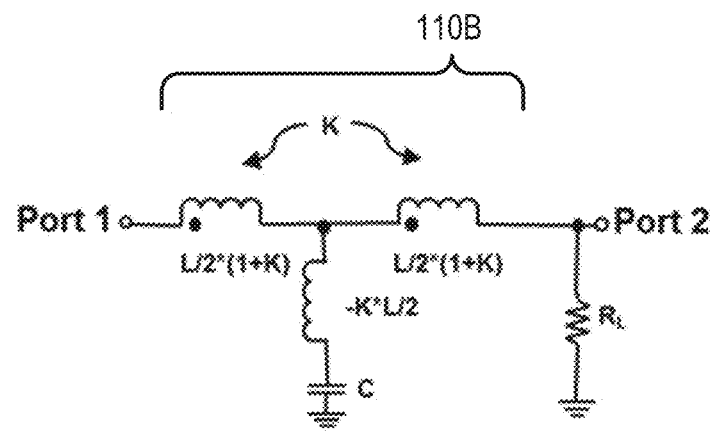
FIG. 1B illustrates generally an equivalent circuit representation of a unit cell comprising magnetically-coupled inductors forming a t-coil arrangement, such as corresponding to a unit cell from the artificial transmission line of FIG. 1A.

FIG. 1B illustrates generally an equivalent circuit representation of a unit cell 110B comprising magnetically-coupled inductors forming a t-coil arrangement, such as corresponding to a unit cell 100A from the artificial transmission line 100 of FIG. 1A. Referring to FIG. 1B, if L1=L2=L/2, then a transfer function can be represented as the transmission scattering parameter, "$S_{21}$", and can be represented as follows:

$$s_{21} = \frac{jR_L(1 + \omega^2 KLC/2)}{\omega^3 L^2 C/4(1 - K^2) - \omega L(K+1) + jR_L(1 - \omega^2 LC/4)},$$

and when K=0, the transfer function can be simplified to provide a unit cell corresponding to a right-handed artificial transmission line having inductors that are not mutually magnetically coupled:

$$s_{21} = \frac{jR_L}{\omega^3 L^2 C/4 - \omega L + jR_L(1 - \omega^2 LC/4)}.$$

In the preceding expressions, "$\omega$" can represent angular frequency value, "j" can represent an imaginary-valued coefficient corresponding to $\sqrt{-1}$, "C" represents a shunt capacitor value, and "$R_L$" can represent a load resistance value.

Figure 2A:
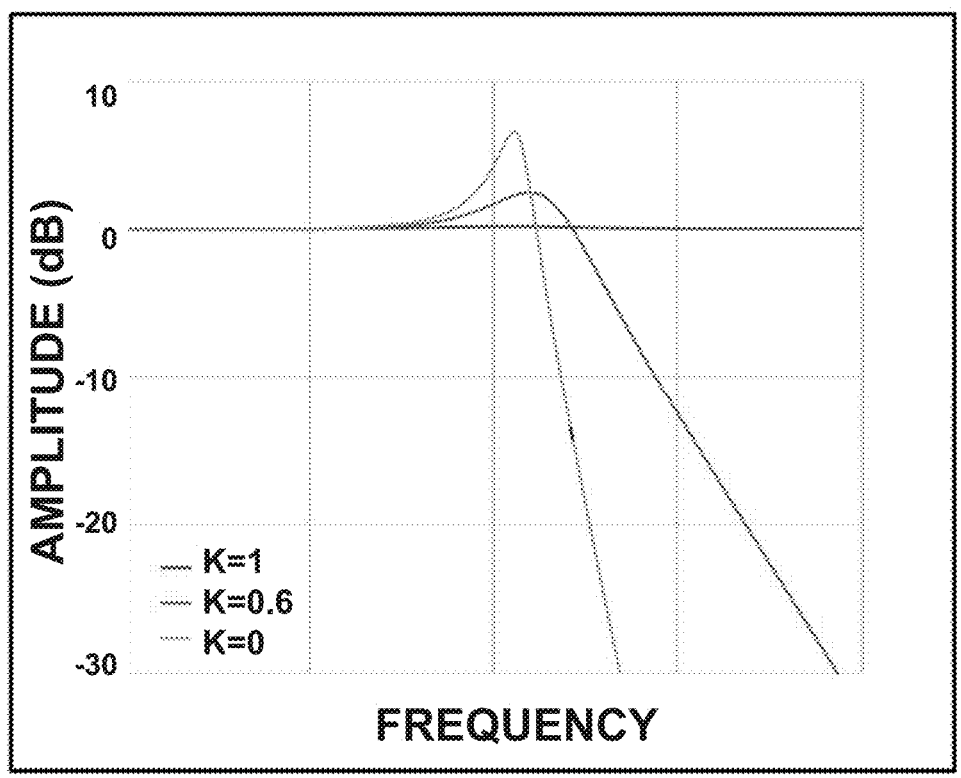
FIG. 2A shows illustrative examples comprising amplitude response plots obtained using simulation of an artificial transmission line having various coupling coefficients between magnetically-coupled inductors.

As can be shown from the expressions above, use of mutually-magnetically coupled inductors can provide bandwidth extension. As "K" approaches unity, bandwidth becomes greater, as shown illustratively in FIG. 2A, which shows illustrative examples comprising amplitude response plots obtained using simulation of an artificial transmission line having various coupling coefficients between magnetically-coupled inductors. As shown in FIG. 2A, when "K" is greater than zero, the −3 dB point, where the output amplitude is decreased by 3 dB relative to the 0 dB reference input amplitude, is extended to higher frequencies, with an idealized case of unlimited bandwidth when K=1. Such bandwidth extension illustrates generally that use of coupled inductors for t-coil sections in unit cells can provide an artificial transmission line structure providing at least one of greater usable bandwidth for the same physical circuit size, or reduced circuit size as compared to other approaches when provided a specified bandwidth.

Figure 2B:
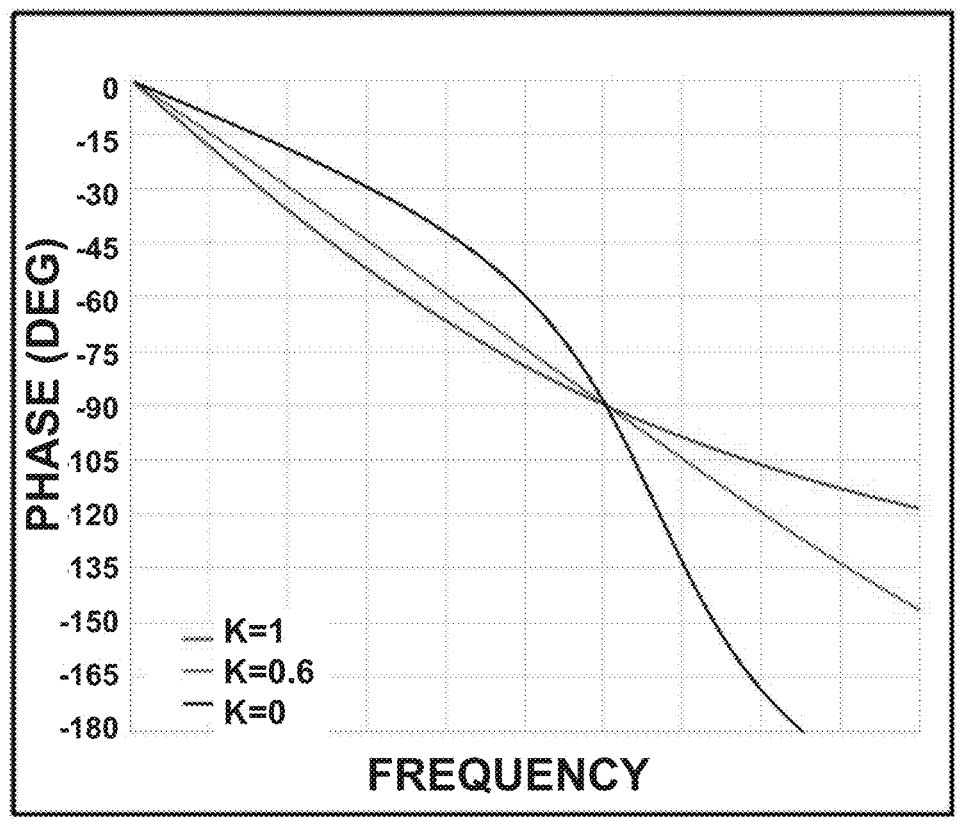
FIG. 2B shows illustrative examples comprising phase response plots obtained using simulation of an artificial transmission line having various coupling coefficients between magnetically-coupled inductors.

FIG. 2B shows illustrative examples comprising phase response plots obtained using simulation of an artificial transmission line having various coupling coefficients between magnetically-coupled inductors. As shown in FIG. 2B, use of non-coupled inductors provides a highly non-linear phase response (e.g., corresponding a right-handed structure having no mutual magnetic coupling where K=0). The present inventors have recognized, among other things, that a phase response can be substantially linearized such as by establishing a coupling coefficient, "K," at an intermediate value between zero and one. For example, as shown in FIG. 2B, a value for the coupling coefficient, "K" can be established between about 0.5 and about 0.7, such as about 0.6. In this manner, a time delay (e.g., a group delay) through the artificial transmission line can be made constant across a specified range of operating frequencies (e.g., reducing dispersion of a signal propagating through the artificial transmission line structure). Other variations on the unit cell topology 110A of FIG. 1A can be used.

Figure 3A:
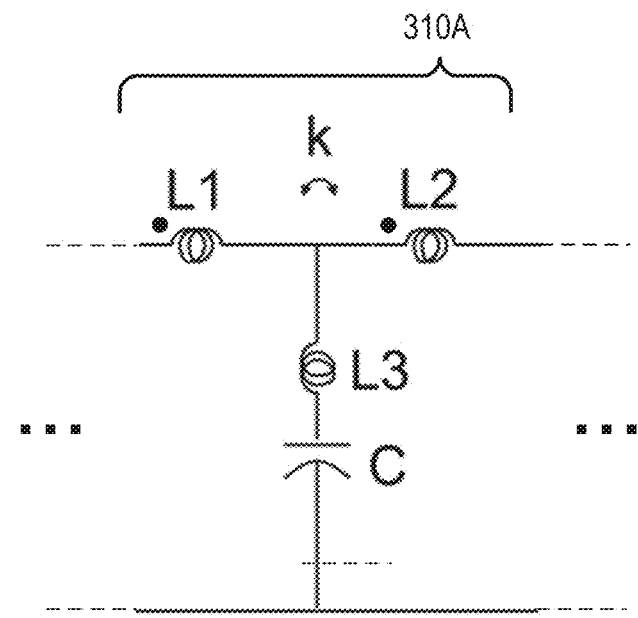
FIG. 3A illustrates generally an example comprising another unit cell topology that can be used to provide an artificial transmission line.

For example, FIG. 3A illustrates generally an example comprising another unit cell 310A topology that can be used to provide an artificial transmission line. As in the example of FIG. 1A, in FIG. 3A, a t-coil section can be established having two inductors, L1 and L2, and a capacitor C. In the example of the unit cell 310A of FIG. 3A, a third inductor, L3, can be coupled between the capacitor C and a node between inductors L1 and L2. A value of L3 can be established to at least partially cancel an equivalent negative inductance term (e.g., −K(L/2) as shown in FIG. 1B), associated with a mutual inductance formed by magnetically coupling inductors L1 and L2. In addition, or instead, a value of L3 can also be used to adjust a phase response to help linearize such a phase response to provide, for example, a constant time delay (e.g., group delay). The third inductor L3 can be arranged to suppress or inhibit mutual magnetic coupling with the first inductor L1 and the second inductor L2 (e.g., by laterally offsetting L3 spatially from L1 or L2, or establishing L3 through parasitic inductance defining a loop that is substantially orthogonal to inductive loops defining L1 or L2).

Figure 3B:
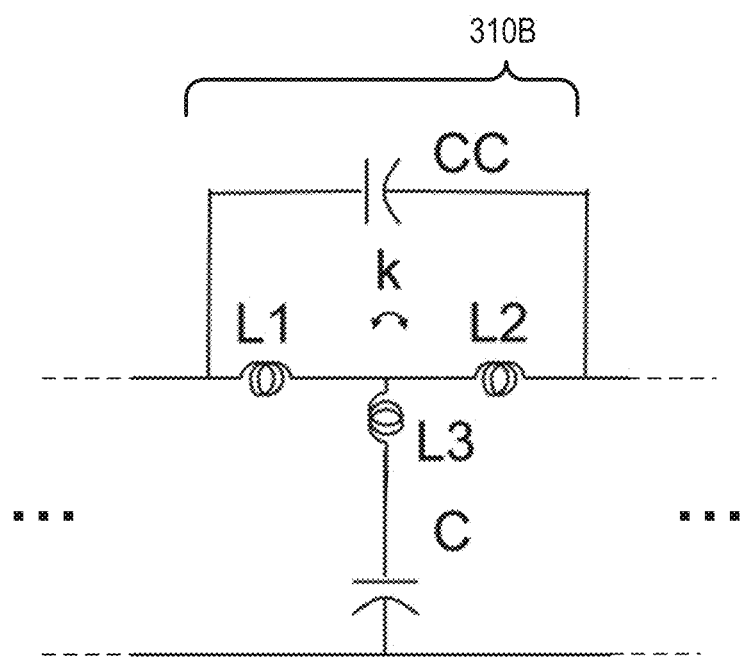
FIG. 3B illustrates generally an example comprising yet another unit cell topology that can be used to provide an artificial transmission line, similar to the unit cell of FIG. 3A, but including a second capacitor.

FIG. 3B illustrates generally an example comprising yet another unit cell 310B topology that can be used to provide an artificial transmission line, similar to the unit cell 310A of FIG. 3A, but including a second capacitor, CC, bypassing the first and second inductors L1 and L2. The addition of capacitor CC provides another degree of freedom to enable control of one or more characteristics of an artificial transmission line comprising two or more unit cells 310B.

Figure 4A:
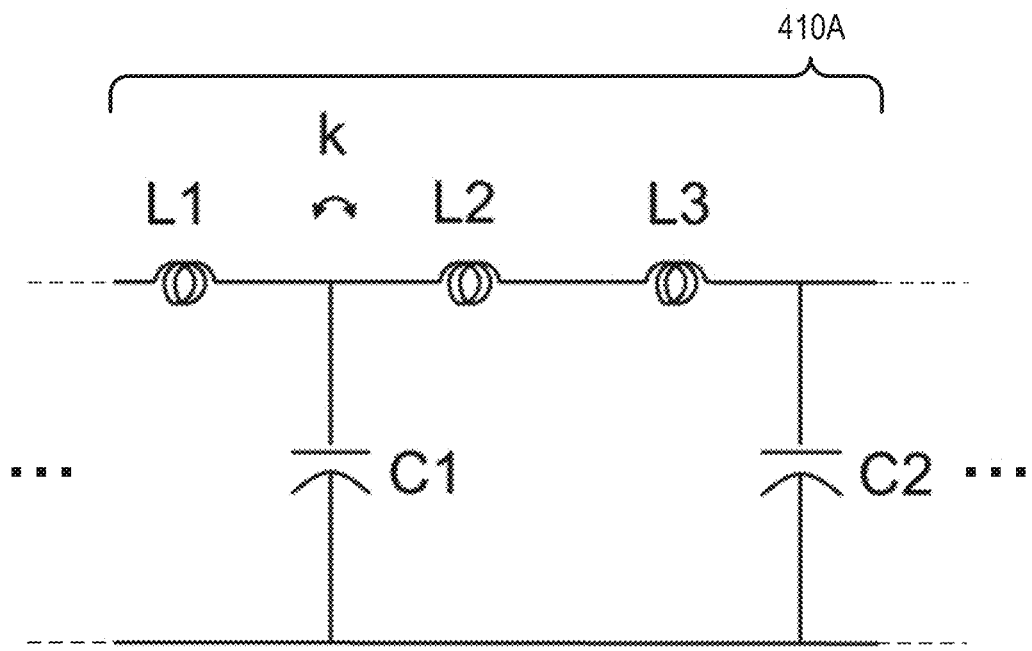
FIG. 4A illustrates generally an example comprising yet another unit cell topology that can be used to provide an artificial transmission line.

FIG. 4A illustrates generally an example comprising yet another unit cell 410A topology that can be used to provide an artificial transmission line. In the example of FIG. 4A, first and second inductors L1 and L2 can be serially-connected, with a first capacitor C1 connected to the node between inductors L1 and L2. As in the examples mentioned above, L and L2 can be mutually magnetically coupled, such as having a magnetic coupling coefficient, "K," as in other examples. A third inductor L3 can be connected in series with inductor L2. The third inductor need not be a discrete inductor. For example, if inductors L1 and L2 are co-integrated within an integrated circuit, inductor L3 can represent a specified parasitic inductance contribution corresponding to conductive couplings between an adjacent unit cell and the unit cell 410A. A second capacitor C2 can be coupled to the third inductor L3, such as at node distal to L2 as shown in the unit cell 410A. In this manner, a combination of the third inductor and a fourth inductor (e.g., representing the first inductor in the next cascaded unit cell) can be considered another t-coil section where the inductors comprising the t-coil are not mutually magnetically coupled, with the second capacitor C2 coupled to a node between the third and fourth inductors and a common node.

Figure 4B:
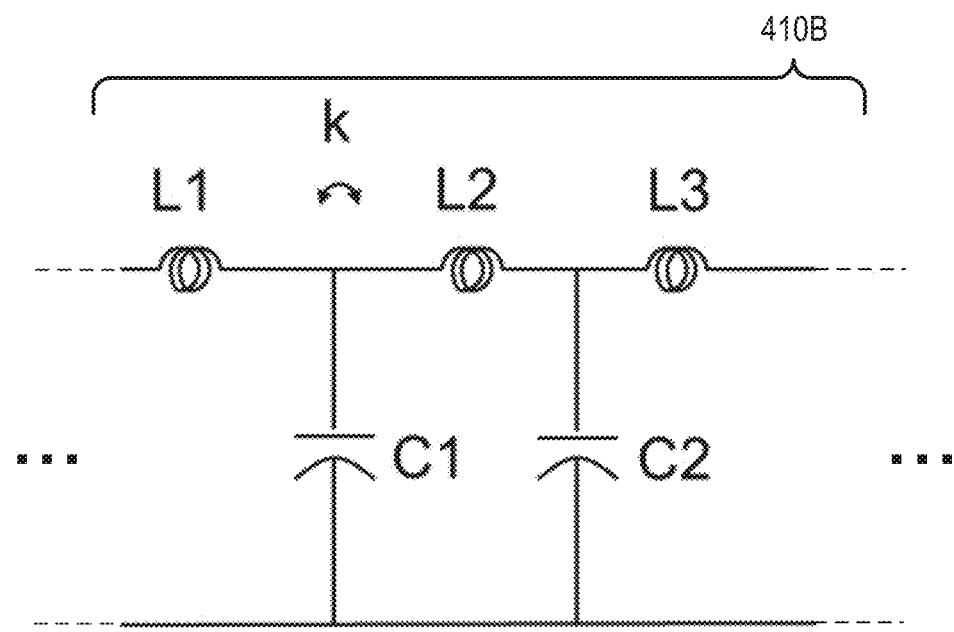
FIG. 4B illustrates generally an example comprising yet another unit cell topology that can be used to provide an artificial transmission line.

FIG. 4B illustrates generally an example comprising yet another unit cell 410B topology that can be used to provide an artificial transmission line, similar to the unit cell 410A, but having the second capacitor C2 coupled to a node between inductors L2 and L3.

In the illustrative examples of FIG. 4A and FIG. 4B, the third inductor L3 is not mutually magnetically coupled with either inductor L or inductor L2. In FIG. 4A and FIG. 4B, the unit cells 410A and 410B provide several component values that can be specified to provide desired electrical characteristics. For example, if an integrated differential inductor topology is used (such as shown and described in the illustrative but non-limiting examples of FIG. 5A and FIG. 5B), a coefficient, "K" may be in a range from about 0.7 to about 0.8. A lower coupling coefficient, "K," such as about 0.55, may be desired to provide enhanced phase linearity. To compensate for a difference between an actual K-value provided by an integrated circuit process, versus a desired value, other component parameters can be adjusted. For examples, values of one or more of L3, C1, C2, L1, and L2 can be varied parametrically to enhance performance across one or more electrical characteristics over a specified operating bandwidth, such as insertion loss, return loss (e.g., impedance matching performance), or phase linearity, as illustrative examples.

Figure 5A:
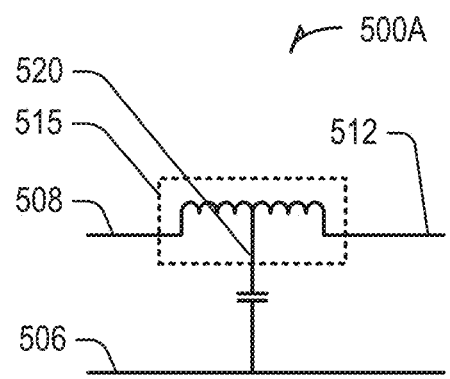
FIG. 5A illustrates generally an example comprising a differential inductor, such as can be fabricated as a portion of a monolithic integrated circuit, or included as a portion of an integrated module, such as to provide a portion of a unit cell forming an artificial transmission line.

FIG. 5A illustrates generally an example 500A comprising a differential inductor 515, such as can be fabricated as a portion of a monolithic integrated circuit, or included as a portion of an integrated module, such as to provide a portion of a unit cell forming an artificial transmission line. A t-coil section, such as mentioned in relation to other examples herein, can include two mutually magnetically-coupled inductors. Such inductors can be formed using a differential inductor 515, such as having a tap 520 to couple a capacitor (or other element) to a node between the two inductive portions of the differential inductor 515. In this manner, the example 500A can provide a unit cell (or a portion of a unit cell) of an artificial transmission line, such as having a two-terminal input port comprising nodes 508 and 506, and an output port comprising a node 512 and the node 506. The output 512 can be coupled to another unit cell, or a series of cascaded unit cells, such as to provide a desired time delay value or phase shift, as an illustrative example.

Figure 5B:
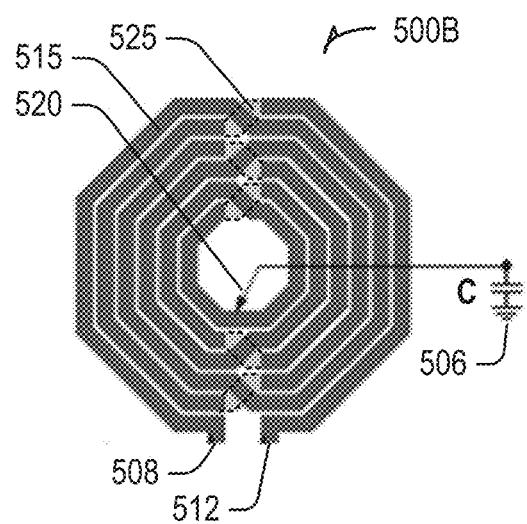
FIG. 5B shows an illustrative example of a layout of conductive layers that can be used to provide a differential inductor.

FIG. 5B shows an illustrative example 500B of a layout of conductive layers that can be used to provide a differential inductor 515. In the example 500B, a first conductive layer (e.g., a metallization layer) of an integrated circuit can define portions of two or more concentric windings. A second conductive layer 525 can be used to conductive couple the portions of the two or more concentric windings, such as through respective via structures. A tap 520 can be provided, such as a center-tap (e.g., to define two equal-valued magnetically-coupled inductors), a capacitor, C, can be coupled between the tap 520 and a common node 506.

Figure 6:
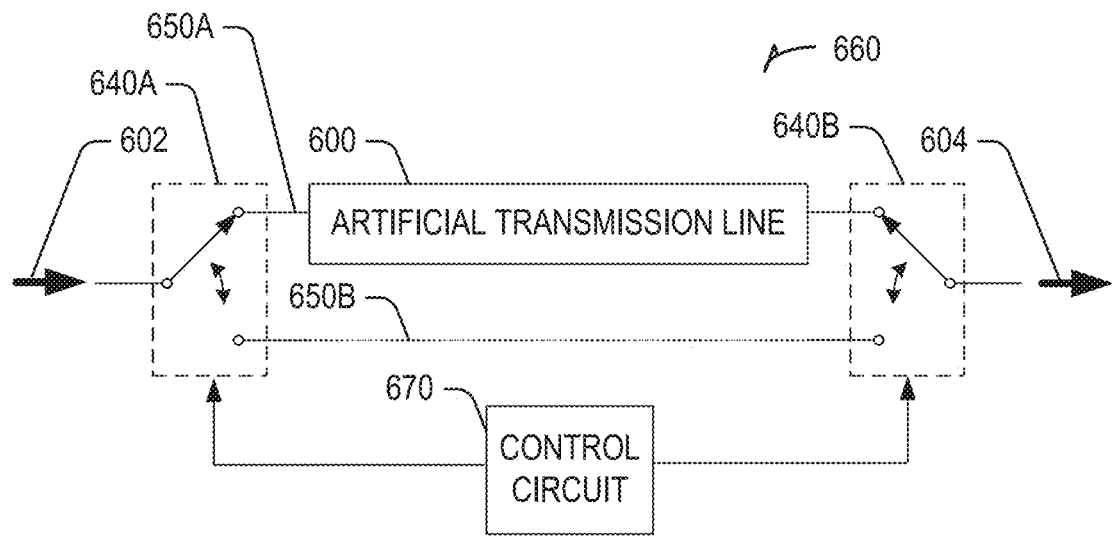
FIG. 6 shows an illustrative example of a phase shifter circuit topology, such as can include one or more artificial transmission lines as shown and described in relation to other examples in this document.

As mentioned in relation to other examples herein, the artificial transmission line structures described in this document can be used for a variety of applications. For example, FIG. 6 shows an illustrative example of a phase shifter circuit 660 topology, such as can include one or more artificial transmission lines as shown and described in relation to other examples in this document. In FIG. 6, an input signal 602 can be coupled to an input port having a first single-pole double-through (SPDT) switch 640A, to select between routing the input signal 602 through a first path 650A defining a first specified time delay (e.g., group delay) or a corresponding phase shift, and a second path 650B define a second, different specified time delay or corresponding phase shift. A second SPDT switch 640B can receive a delayed representation of the input signal 602, such as routing the delayed signal to an output port to provide an output signal 604. The states of the first and second SPDT switches 640A and 640B can be controlled using a control circuit 670. For example, the SPDT switches can include solid-state switching structures (e.g., field-effect transistors or other semiconductor switching devices) or mechanical switches (e.g., MEMS relay devices), and the control circuit 670 can receive a control signal and generate an appropriate drive signal (e.g., a gate drive signal or other signal) to actuate the first or second switches 640A or 640B. One or more of the first or second paths 650A or 650B can include an artificial transmission line 600, such as shown and described in relation to other examples herein. For example, the artificial transmission line 600 can include two or more cascaded unit cells comprising respective t-coil sections including mutually magnetically-coupled inductors.

Figure 7:
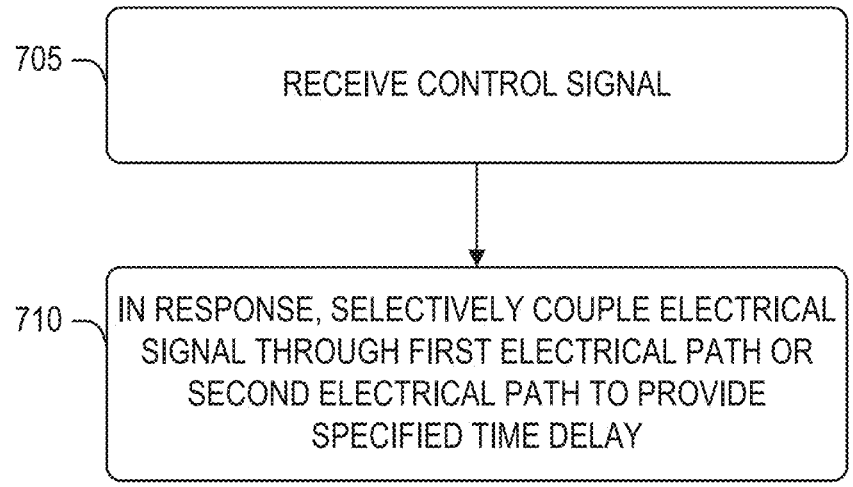
FIG. 7 illustrates generally a technique, such as a method, comprising receiving a control signal, and, in response, selectively coupling an electrical signal through a first electrical path or a second electrical path, such as using a phase shifter circuit topology as shown illustratively in FIG. 6.

FIG. 7 illustrates generally a technique, such as a method, comprising receiving a control signal at 705, and, in response, at 710, selectively coupling an electrical signal through a first electrical path or a second electrical path, such as using a phase shifter circuit topology as shown illustratively in FIG. 6.

Each of the non-limiting aspects in this document can stand on its own, or can be combined in various permutations or combinations with one or more of the other aspects or other subject matter described in this document.

The above detailed description includes references to the accompanying drawings, which form a part of the detailed description. The drawings show, by way of illustration, specific embodiments in which the invention can be practiced. These embodiments are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to The claimed invention is:

1. An electronic circuit defining an artificial transmission line structure comprising at least two unit cells, wherein a respective unit cell amongst the at least two unit cells comprises:
   a first t-coil section defined by a first inductor mutually magnetically coupled and conductively coupled in series with a second inductor, and a first shunt capacitor coupled to a node between the first inductor and the second inductor; and
   a third inductor conductively coupled in series with the second inductor, the third inductor located between the second inductor and an output node of the respective unit cell;
   wherein the third inductor is arranged to suppress or inhibit mutual magnetic coupling of the third inductor with the first inductor and to suppress or inhibit mutual magnetic coupling of the third inductor with the second inductor.

2. The electronic circuit of claim 1, comprising a fourth inductor conductively coupled in series with the first shunt capacitor.

3. The electronic circuit of claim 1, comprising a second capacitor connected to bypass the first and second inductors, the second capacitor connected between an input node of the first t-coil section and an output node of the first t-coil section.

4. The electronic circuit of claim 1, wherein values of the first, second, and third inductors are specified to provide a substantially linear phase response in a specified range of frequencies.

5. The electronic circuit of claim 1, wherein a coupling coefficient corresponding to mutual magnetic coupling between the first inductor and the second inductor is established at an intermediate value between zero and one to provide a substantially linear phase response.

6. The electronic circuit of claim 5, wherein the intermediate value is between about 0.5 and about 0.7.

7. The electronic circuit of claim 1, wherein the first and second inductors have the same self-inductance value.

8. The electronic circuit of claim 1, wherein the respective unit cell comprises a second shunt capacitor coupled to a node of the third inductor.

9. The electronic circuit of claim 8, wherein the respective unit cell comprises a second t-coil section defined by the second inductor and the third inductor, the second t-coil section comprising the second shunt capacitor coupled to a node of the third inductor between second inductor and the third inductor.

10. The electronic circuit of claim 9, comprising a fourth inductor in series with the first shunt capacitor.

11. The electronic circuit of claim 8, wherein the second shunt capacitor j coupled to the output node at the third inductor opposite the node between the second inductor and the third inductor.

12. The electronic circuit of claim 1, wherein the first and second inductors are defined by a symmetrical differential inductor.

13. The electronic circuit of claim 1, wherein the first and second inductors have the same self inductance value.

14. The electronic circuit of claim 1, comprising a phase shifter circuit including at least two selectable electrical paths coupling an input port to an output port, wherein one of the at least two selectable electrical paths comprises the artificial transmission line structure.

15. An electronic circuit defining an integrated phase shifter circuit, the electronic circuit comprising:
   a first electrical path to provide a first specified phase shift, the first electrical path comprising an artificial transmission line structure comprising at least two unit cells, wherein a respective unit cell amongst the at least two unit cells comprises:
   a first t-coil section defined by a first inductor mutually magnetically coupled and conductively coupled in series with a second inductor, and a first shunt capacitor coupled to a node between the first inductor and the second inductor; and
   a third inductor conductively coupled in series with the second inductor, the third inductor located between the second inductor and an output node of the respective unit cell;
   wherein the third inductor is arranged to suppress or inhibit mutual magnetic coupling of the third inductor with the first inductor and to suppress or inhibit mutual magnetic coupling of the third inductor with the second inductor; and
   a second electrical path to provide a second specified phase shift different than the first specified phase shift;
   at least a first switch to selectively couple an input signal through the first electrical path or the second electrical path in response to a control signal.

16. The electronic circuit of claim 15, wherein values of the first, second, and third inductors are specified to provide a substantially linear phase response in a specified range of frequencies.

17. The electronic circuit of claim 15, wherein a coupling coefficient corresponding to mutual magnetic coupling between the first inductor and the second inductor is established at an intermediate value between about 0.5 and about 0.7.

18. A method for controlling a delay value for an electrical signal using a phase shifter circuit, the method comprising:
   receiving a control signal and, in response, selectively coupling the electrical signal through one of a first electrical path to provide a first specified phase shift or a second electrical path to provide a second specified phase shift different than the first specified phase shift;
   wherein the first electrical path comprises an artificial transmission line structure comprising at least two unit cells, wherein a respective unit cell amongst the at least two unit cells comprises:
   a first t-coil section defined by a first inductor mutually magnetically coupled and conductively coupled in series with a second inductor, and a first shunt capacitor coupled to a node between the first inductor and the second inductor; and a third inductor conductively coupled in series with the second inductor, the third inductor located between the second inductor and an output node of the respective unit cell;

wherein the third inductor is arranged to suppress or inhibit mutual magnetic coupling of the third inductor with the first inductor and to suppress or inhibit mutual magnetic coupling of the third inductor with the second inductor.

19. The method of claim 18, wherein values of the first, second, and third inductors are specified to provide a substantially linear phase response in a specified range of frequencies.

20. The method of claim 18, wherein a coupling coefficient corresponding to mutual magnetic coupling between the first inductor and the second inductor is established at an intermediate value between about 0.5 and about 0.7.

* * * * *